(12) United States Patent
Wiseman

(10) Patent No.: US 8,673,072 B2
(45) Date of Patent: *Mar. 18, 2014

(54) CRYSTAL GROWER WITH INTEGRATED LITZ COIL

(75) Inventor: Donald H. Wiseman, Waukesha, WI (US)

(73) Assignee: ABP Induction, LLC, North Brunswick, NJ (US)

( * ) Notice: Subject to any disclaimer, the term of this patent is extended or adjusted under 35 U.S.C. 154(b) by 1077 days.

This patent is subject to a terminal disclaimer.

(21) Appl. No.: 12/636,991

(22) Filed: Dec. 14, 2009

(65) Prior Publication Data

US 2010/0089312 A1   Apr. 15, 2010

Related U.S. Application Data

(63) Continuation-in-part of application No. 10/707,909, filed on Jan. 23, 2004, now Pat. No. 7,632,350.

(51) Int. Cl.
*C30B 15/14* (2006.01)

(52) U.S. Cl.
USPC ............... 117/13; 117/34; 117/208; 117/217

(58) Field of Classification Search
USPC ...................... 117/13, 34, 208, 217
See application file for complete search history.

(56) References Cited

U.S. PATENT DOCUMENTS

| | | |
|---|---|---|
| 3,857,679 A | 12/1974 | Allred |
| 4,249,988 A | 2/1981 | Lavigna et al. |
| 4,321,690 A | 3/1982 | Imura |
| 5,461,215 A | 10/1995 | Haldeman |
| 5,660,754 A | 8/1997 | Haldeman |
| 5,679,151 A | 10/1997 | Ohmoto et al. |
| 6,117,230 A | 9/2000 | Ammon et al. |
| 6,229,126 B1 | 5/2001 | Ulrich et al. |
| 6,285,011 B1 | 9/2001 | Cherko |
| 6,346,690 B1 | 2/2002 | Ulrich et al. |
| 6,355,910 B1 | 3/2002 | Seidl et al. |
| 6,402,840 B1 | 6/2002 | Pandelisev |
| 7,632,350 B2 * | 12/2009 | Wiseman ............... 117/34 |

* cited by examiner

*Primary Examiner* — Bob M Kunemund
(74) *Attorney, Agent, or Firm* — Ziolkowski Patent Solutions Group, SC

(57) ABSTRACT

An apparatus and method of manufacturing a crystal grower is disclosed. The crystal growing apparatus includes a receptacle constructed to receive a material selected to grow a crystal and an induction heater constructed to heat the material, with the induction heater comprising a Litz coil and a hose constructed to receive the Litz coil therein. The hose further comprises an inner liner formed of an electrically non-conductive material, a reinforcement layer surrounding the inner liner to provide structural reinforcement thereto, and an outer liner applied about the reinforcement layer to form an exterior of the hose.

19 Claims, 5 Drawing Sheets

CRYSTAL GROWER WITH INTEGRATED LITZ COIL

CROSS REFERENCE TO RELATED APPLICATION

The present invention is a continuation-in-part of, and claims priority to, U.S. patent application Ser. No. 10/707,909, filed Jan. 23, 2004, the disclosure of which is incorporated herein by reference.

BACKGROUND OF THE INVENTION

The present invention relates generally to crystal growers, and more particularly, to a crystal grower having an integrated Litz coil induction heater.

The process of crystal growing has applications to many industries including the electronics industry. Many semiconductors are formed by the crystal growing process. The process of crystal growing requires heating a base material to a molten state thereby forming a molten pool of crystalline base material. A seed is then placed in contact with the molten pool of material and withdrawn therefrom. As the seed is withdrawn from the molten material pool, a portion of the molten material is withdrawn from the pool in the form of a ribbon thereby growing the crystal.

In order to grow the crystal from the pool of molten material, the pool of molten material must be maintained at a precise temperature depending partly upon the material properties of the base material. Pool temperatures that are below a desired temperature can result in excessive crystal sizes or can result in non-homogenous mixing of the constituent components of the molten material. Temperatures that are above a desired temperature can result in a crystalline structure that is unstable. This instability results in reduced lengths of crystal that can be grown at the increased temperatures. The viscosity of the molten material at increased temperatures cannot support the tension of a crystal being withdrawn from the pool. Therefore, in order to facilitate a desired rate of crystal growth and a desired crystal quality, the pool of molten crystalline base material must be precisely maintained. Induction heaters offer an accurate and easy to control heat source and are commonly used to maintain a desired pool temperature.

Known induction heaters generally consist of a coil of conductive tubing. As a high frequency alternating current is passed through the conductive tubing, a magnetic flux is generated. The coil is positioned generally adjacent an object to be heated and the magnetic flux of the coil induces a current in the material to be heated. Due to the internal resistance of the material to be heated, inducing a current in the material results in the heating of the material. In the case of crystal growing, the induction heater induces enough current to melt the material positioned in a reservoir adjacent the induction heater. Alternatively, the reservoir can be constructed of a material that is responsive to induction heating such that heating of the reservoir results in indirect induction heating of the material. Regardless of which heating strategy is applied, a thermal isolator is generally positioned between the heating target and the induction heater to minimize radiation thermal exchange between the induction coil and the heating target.

Known crystal growers are generally electrically inefficient devices. Due in part to the thermal isolator, a distance is maintained between the heating target and the induction coil. In order to achieve the desired induction current, and therefore temperature, in the target, increased currents must be applied to the induction heater coil. The electrical resistance of the induction heater coil contributes to the total power loss of coil. As the electrical current demand on the induction coil heater increases, the overall efficiency of the induction heater coil decreases. A significant amount of the total energy applied to the induction heater is not used to induce current, and thereby generate heat, in the crystalline material. Therefore, it takes a considerable amount of energy to heat the crystalline base material to a molten state.

In order to induce a sufficient current in the material or the reservoir, the induction heater is subject to a high frequency alternating current. The electrical efficiency of the induction heater is partly determined by the electrical resistance of the induction heater coil to the high frequency alternating current. The distance between the induction heater and the target and the electrical resistance of the induction heater coil contribute to decreases in the overall efficiency of the crystal grower. A user of such a crystal grower must expend considerable resources for all of the energy consumed by the induction heater including that portion of the energy that is not utilized for inducing current in the crystalline base material.

It would therefore be desirable to have a crystal grower capable of heating a crystalline material with appreciable efficiency over known crystal growers. Since the cost of growing crystals is disproportionately weighted toward energy use, such a system would have significant advantages to not only each user, but also to the general environment and economy.

BRIEF DESCRIPTION OF THE INVENTION

The present invention provides a crystal growing apparatus, a method of manufacturing a crystal grower, and an induction heater that solves the aforementioned problems.

In accordance with one aspect of the present invention, a crystal growing apparatus is disclosed having a receptacle constructed to receive a material selected to grow a crystal and an induction heater constructed to heat the material, the induction heater comprising a Litz coil and a hose constructed to receive the Litz coil therein. The hose further comprises an inner liner formed of an electrically non-conductive material, a reinforcement layer surrounding the inner liner to provide structural reinforcement thereto, and an outer liner applied about the reinforcement layer to form an exterior of the hose.

In accordance with another aspect of the present invention, a method of manufacturing a crystal grower is disclosed. The method includes the steps of providing a reservoir to receive a crystal growing material therein and coiling a Litz coil about the reservoir. The method also includes the steps of attaching at least one leg to the coiled portion of the Litz coil to maintain a coiled orientation of the coiled portion of the Litz coil and casting a refractory housing about the coiled portion of the Litz coil, the refractory housing being affixed to the at least one leg.

In accordance with yet another aspect of the present invention, an induction heater is disclosed including a casing having a first end and a second end and a coil of woven strands of wire having a first end and a second end and passing through the casing. The induction heater also includes a lead connected to an end of the coil of woven strands of wire and having a passage therethrough, the passage constructed to provide coolant to a space between the coil of woven strands of wire and the casing. The casing further includes an inner liner formed of an electrically non-conductive material, a reinforcement layer surrounding the inner liner to provide structural reinforcement thereto, and an outer liner applied about the reinforcement layer to form an exterior of the hose.

Various other features, objects and advantages of the present invention will be made apparent from the following detailed description and the drawings.

BRIEF DESCRIPTION OF THE DRAWINGS

The drawings illustrate one preferred embodiment presently contemplated for carrying out the invention.

In the drawings.

DETAILED DESCRIPTION OF THE PREFERRED EMBODIMENT

Figure 1:
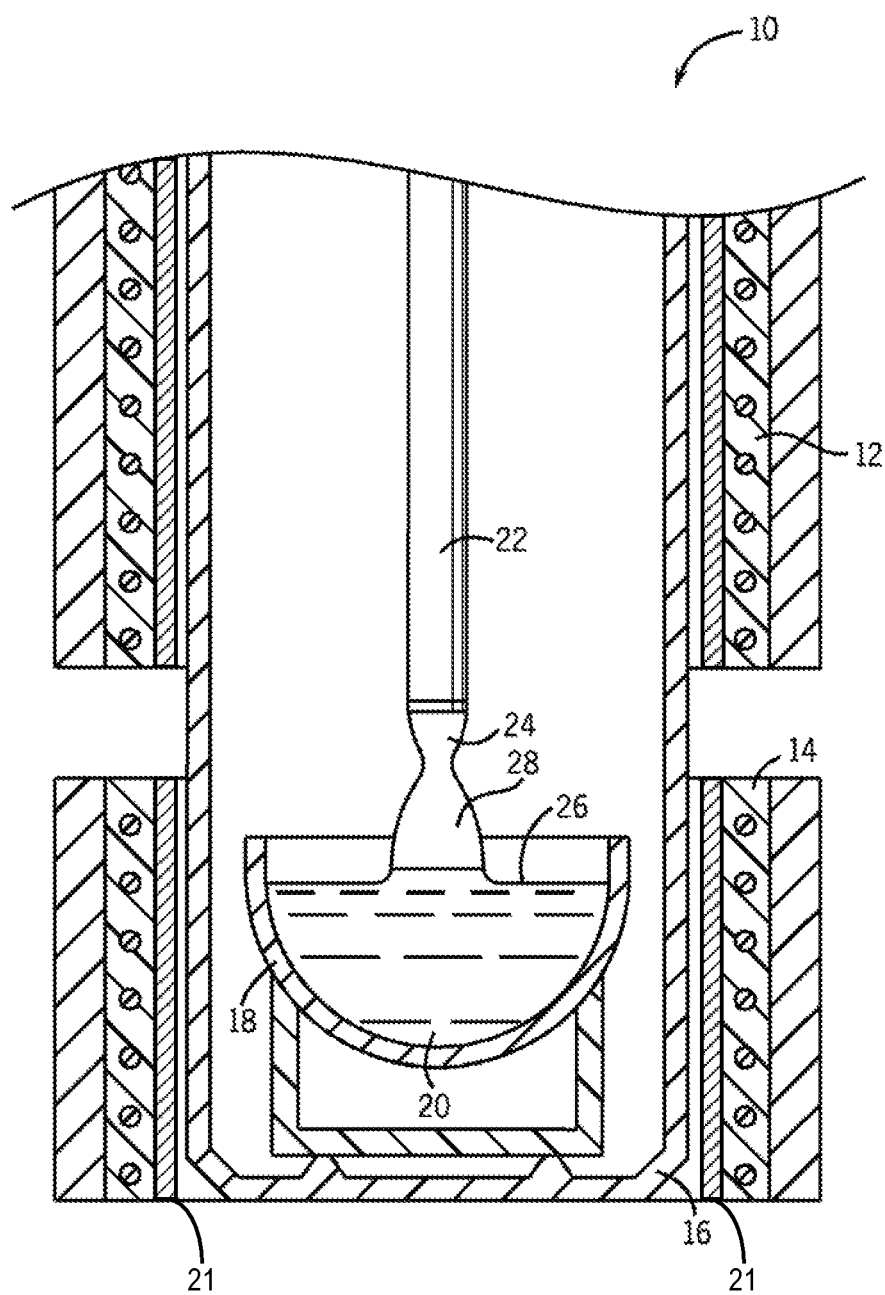
FIG. 1 is a crystal grower according to the present invention.

The present invention relates to crystal growers, and preferably, those incorporating induction type heating coils. FIG. 1 shows a crystal grower 10 having two such heaters 12 and 14. Induction heaters 12, 14 are positioned about enclosure 16. Enclosure 16 reduces atmospheric contamination of a crystal grown therein. Additionally, enclosure 16 may be filled with an inert gas to further support desired crystalline quality. Within enclosure 16, a vessel, crucible, or reservoir 18, is constructed to contain a crystalline base material 20 therein. Heater 14, when energized, induces current in crystalline base material 20 thereby melting the base material to a molten state. Alternatively, reservoir 18 could be constructed of a material that is responsive to induction heating such that, rather than induction heating of base material 20 directly, induction heater 14 may heat reservoir 18, thereby indirectly heating base material 20 positioned in the reservoir.

According to one embodiment, a replaceable liner 21 is positioned between reservoir 18 and induction heater 12, 14 to serve as a thermal barrier for the coil assembly of the induction heater. The replaceable liner 21 is constructed from a high temperature ceramic and is formed as a cylinder extending a full length of the induction heater 12, 14. The replaceable liner 21 has an inside diameter larger than enclosure 16, thereby allowing the enclosure 16 to be easily placed within the liner area. The outside diameter of replaceable liner 21 is slightly smaller than an inner diameter of the induction coil of induction heaters 12, 14. Beneficially, replaceable liner 21 provides a high thermal impedance barrier between the reservoir 18 and the coil assembly of induction heater 12, 14, thereby insulating the inside diameter of the induction heater 12, 14 from the thermal stress resulting from its close proximity to inductively heated reservoir 18 (and/or the inductively heated material therein). Additionally, placing replaceable liner 21 between reservoir 18 and induction heater 12, 14 will facilitate repair and/or rebuilding of the induction coil thereof. Furthermore, due to a temperature differential that may exist between reservoir 18 and induction heater 14 during operation, the insulating replaceable liner 21 reduces inadvertent cooling of reservoir 18 by induction heater 14.

Referring still to FIG. 1, once crystalline base material 20 is in a generally homogenous molten state, a puller 22 introduces a seed, or tip 24, into contact with an upper surface 26 of base material 20. Puller 22 is then withdrawn from crystalline base material 20 forming a crystal 28 therebetween. The process of withdrawing crystal 28 from crystalline base material 20 is commonly known as growing, or pulling, a crystal. Optional induction heater 12 maintains a temperature of the crystal 28 as it is drawn from crystalline base material 20 by puller 22. Although induction heaters 12 and 14 are shown outside of enclosure 16, it is equally understood that heaters 12 and 14 could be positioned within enclosure 16.

Figure 2:
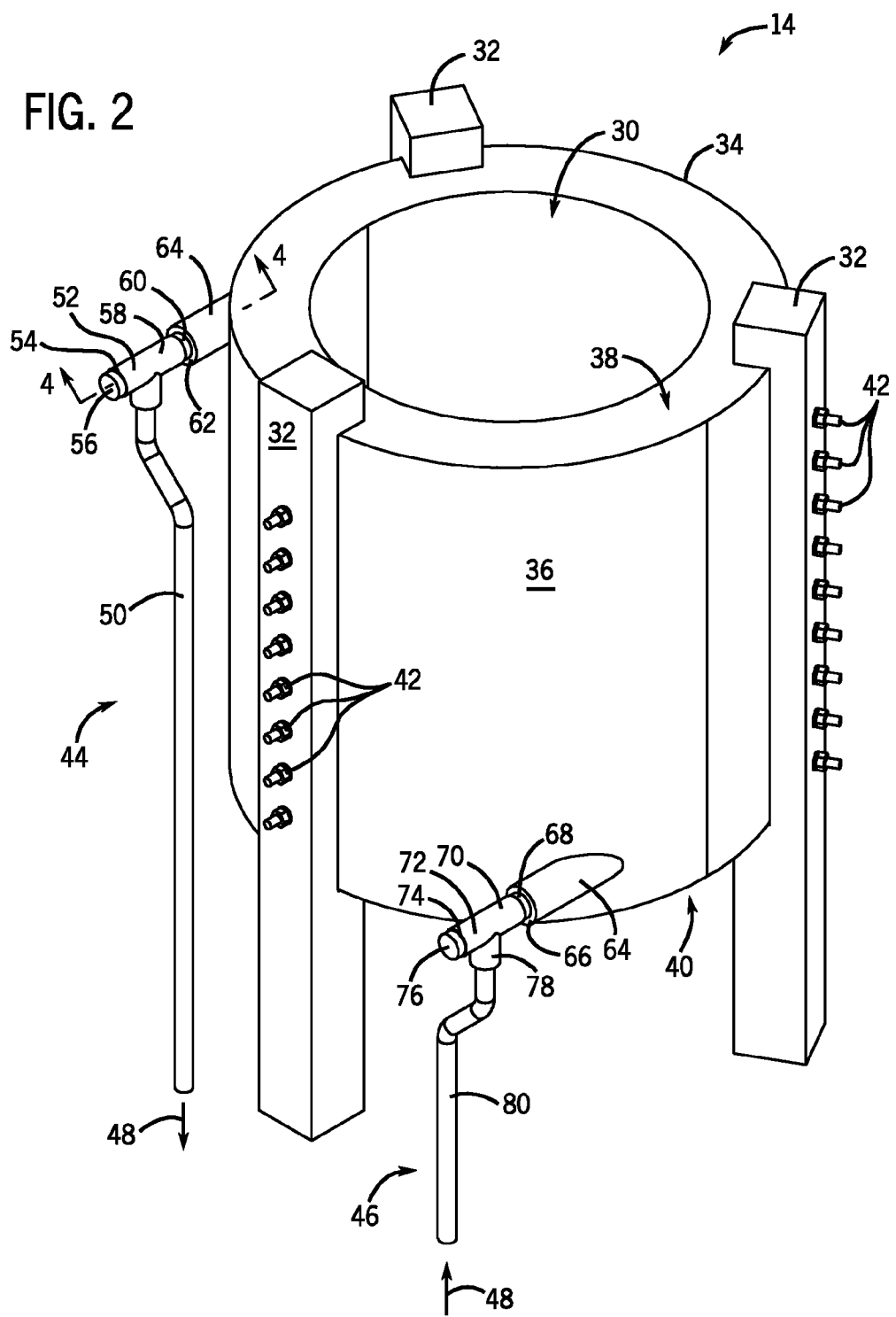
FIG. 2 is a perspective view of the induction heater shown in FIG. 1.

Referring to FIG. 2, induction heater 14 has an opening 30 formed therein defined by a housing, or body 36, of the induction heater, with opening 30 being constructed to allow placement of reservoir 18 and enclosure 16 therein, as shown in FIG. 1. A plurality of legs 32 are positioned about a perimeter 34 of housing 36 of induction heater 14. Each leg 32 extends from a first end 38 of body 36 and past a second end 40 of body 36. A plurality of cable ties 42 pass through legs 32 and engage a coil disposed in body 36 as will be described further below with respect to FIG. 5. While legs 32 are shown in FIG. 2 as extending downward beyond the end of housing 36, it is recognized that legs may also be constructed so as not to extend downward beyond the end of housing 36. That is, according to one embodiment, extending legs 32 beyond the end of housing 36 provides a mechanism to properly mount induction heater 14 relative to the position of crucible 18 (FIG. 1). According to another embodiment, the extension of legs 32 beyond the end of housing 36 is not necessary for locating induction heater 14 relative to crucible 18. A first connector 44 and a second connector 46 electrically connect induction heater 14 to a power source (not shown). It is understood that the power source may be designed to supply power at a high frequency, preferably above 3,000 Hz. Additionally, first connector 44 and second connector 46 are hollow and allow a cooling path, indicated by arrow 48, to circulate a cooling flow through induction heater 14.

First connector 44 includes a lead 50 which extends to a tee 52. Tee 52 has a first end 54 connected to an end cap 56 and a second end 58 connected to an extension 60 of first connector 44. Extension 60 connects tee 52 with a first end 62 of a casing, or hose 64. Hose 64 winds concentrically through body 36 of induction heater 14 to a second end 66. An extension 68 connects second end 66 of hose 64 with a first end 70 of a tee 72. A second end 74 of tee 72 has an end cap 76 attach thereto. A third end 78 of tee 72 is connected to a lead 80 of second connector 46.

Figure 3:
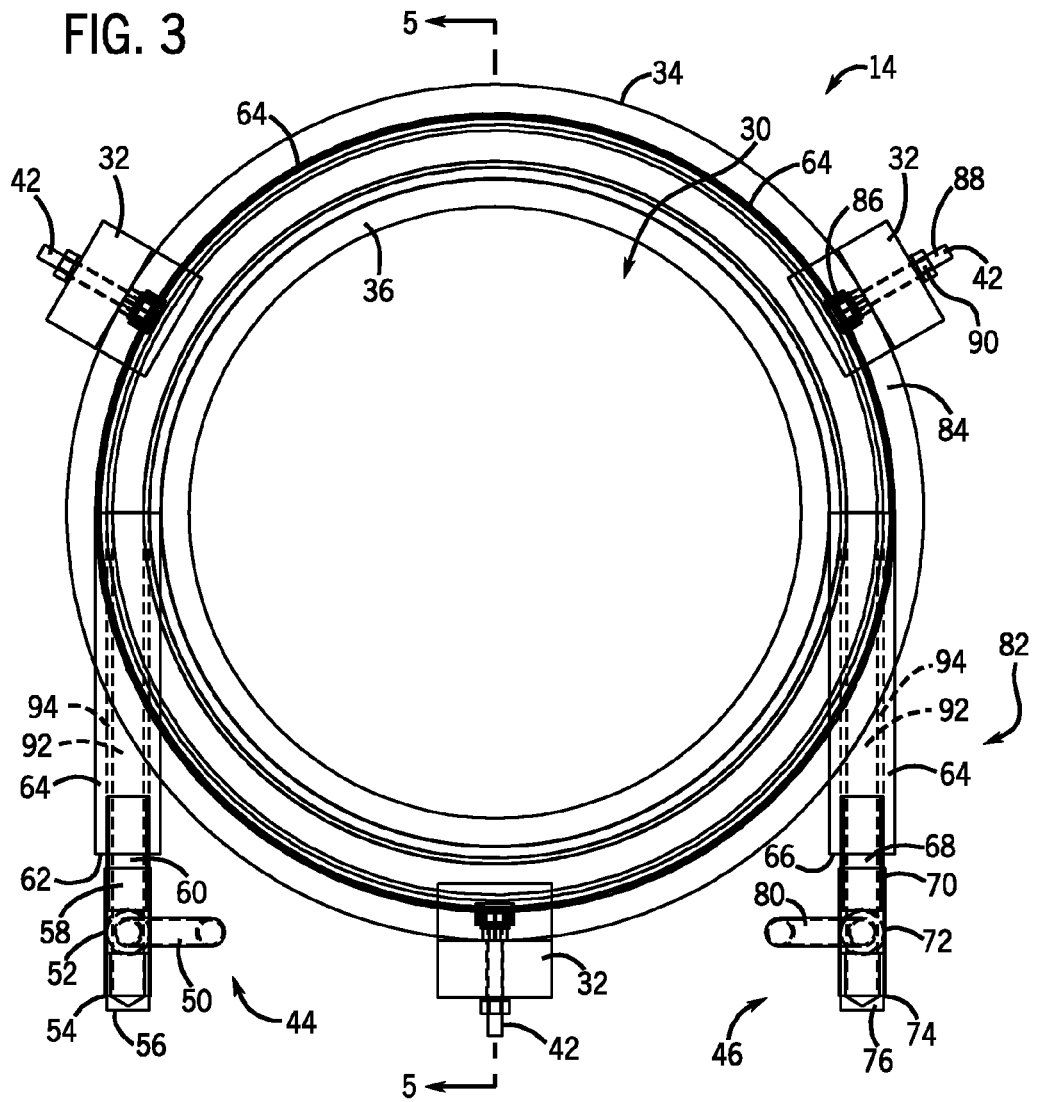
FIG. 3 is an end view of the induction heater of FIG. 2.

As shown in FIG. 3, first connector 44 and second connector 46 exit a common side 82 of body 36 of induction heater 14. Legs 32 are positioned about perimeter 34 of body 36. Cable ties 42 extend through legs 32 and into an outer portion 84 of body 36 of induction heater 14. A first end 86 of each cable tie 42 engages hose 64 of induction heater 14. A second end 88 of each cable tie 42 extends beyond leg 32 and is engaged by a nut 90. Such a construction positions individual windings of hose 64 radially and axially uniformly within body 36 of induction heater 14. A coil 92, having a plurality of individually strands of wire which exhibit Litz characteristics, extends from end cap 56 of first connector 44, passes through hose 64, to end cap 76 of second connector 46. A gap 94 is maintained between coil 92 and hose 64 to allow for the circulation of cooling fluid through the hose. Coil 92 is electrically connected to both first connector 44 and second connector 46 to complete an electrical circuit through induction heater 14.

Figure 4:
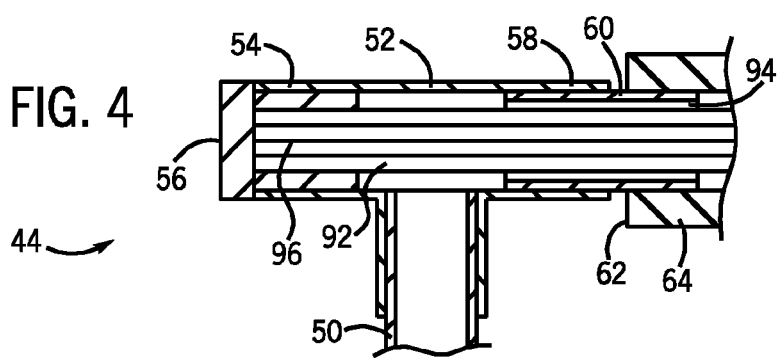
FIG. 4 is a cross-sectional view of a lead of the induction heater of FIG. 2.

As shown in FIG. 4, coil 92 extends through hose 64, extension 60, tee 52, and into end cap 56. A first end 96 of coil 92 is soldered into end cap 56. End cap 56 is soldered into first end 54 of tee 52. Such a construction electrically connects the individual strands of coil 92 to lead 50. Extension 60 connects tee 52 to first end 62 of hose 64. Gap 94 allows a cooling flow circulated through lead 50 to pass over coil 92, through extension 60, and into hose 64. Such a construction allows for electrically connecting coil 92 to a power source (not shown) and for the connection of induction heater 14 to a fluid coolant source (not shown). Second connector 46, shown in FIG. 3, is constructed similar to first connector 44, as shown in FIG. 4. As such, a cooling loop is completed between first connector 44 and second connector 46. Such a construction allows coil 92 to be fluidly cool during operation.

Figure 5:
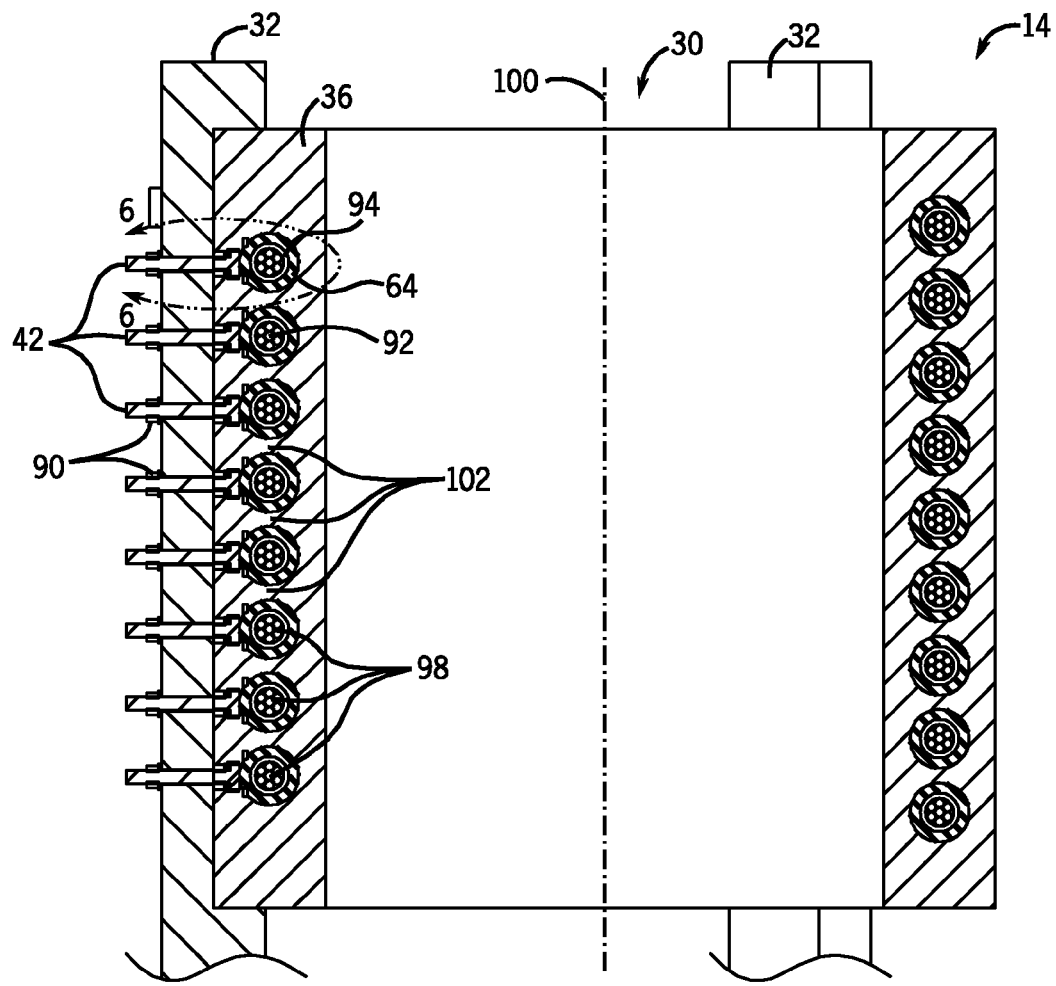
FIG. 5 is a cross-sectional view of the induction heater of FIG. 2.

As shown in FIG. 5, coil 92 has a plurality of individual windings 98 equally spaced from an axis 100 of induction heater 14. Cable ties 42 maintain a uniform gap 102 between adjacent windings 98 and space windings 98 equidistantly from axis 100. The uniform positioning of windings 98 of induction heater 14 ensures uniform heating of a material placed in opening 30. Replaceable liner 21 is positioned within housing 36 such that it provides a thermal barrier between coil 92 and reservoir 18 (FIG. 1).

According to an exemplary embodiment, cable ties 42 and legs 32 function to maintain a uniform gap 102 between windings 98 (i.e., position the turns of coil 92 in their appropriate position) during a "casting process" of housing 36. That is, according to one embodiment of the invention, housing 36 is created using a cement-like castable refractory material that, once cured, provides a rigid housing that captures the coil 92, securing the turns in their proper position. The refractory material of housing 36 acts as a thermal insulation, reducing the amount of radiated thermal energy being lost to the ambient by the crystal growing process. The refractory material reduces the energy absorbed by the water cooled induction coil 92 by acting as a thermal insulator. Beneficially, lower radiated losses from the crystal growing process means that less induction energy is required to maintain the process temperature.

Figure 6:
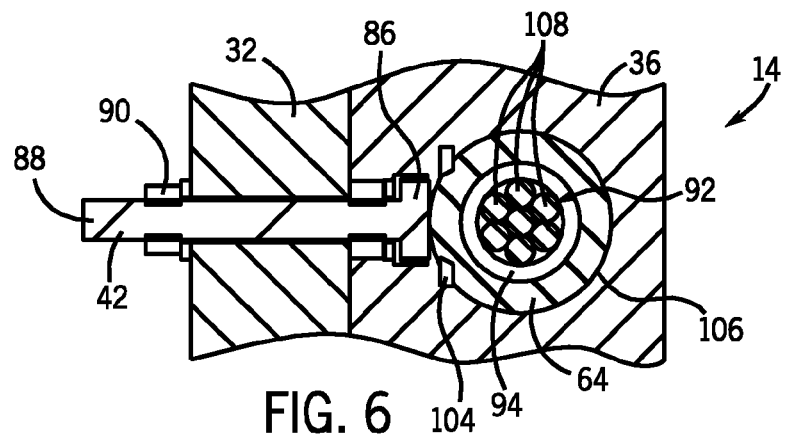
FIG. 6 is a cross-sectional view of a single winding of a coil of the induction heater of FIG. 2.

FIG. 6 shows the arrangement of a single cable tie 42 to induction heater 14. A clip 104 extends from first end 86 of cable tie 42 and engages in outer diameter 106 of hose 64. Second end 88 of cable tie 42 receives a nut 90 thereabout and secures leg 32 to body 36 of induction heater 14. In hose 64, gap 94 surrounds a plurality of strands of wire 108 which form coil 92. Each respective strand of wire is electrically insulated from adjacent strands and has Litz characteristics when energized, such as low electrical skin losses. One skilled in the art will recognize that Litz characteristics include low losses at high frequencies and, as a result of the relative size of each strands of wire, power losses are less when compared to conventional or non-Litz configurations.

Figure 7:
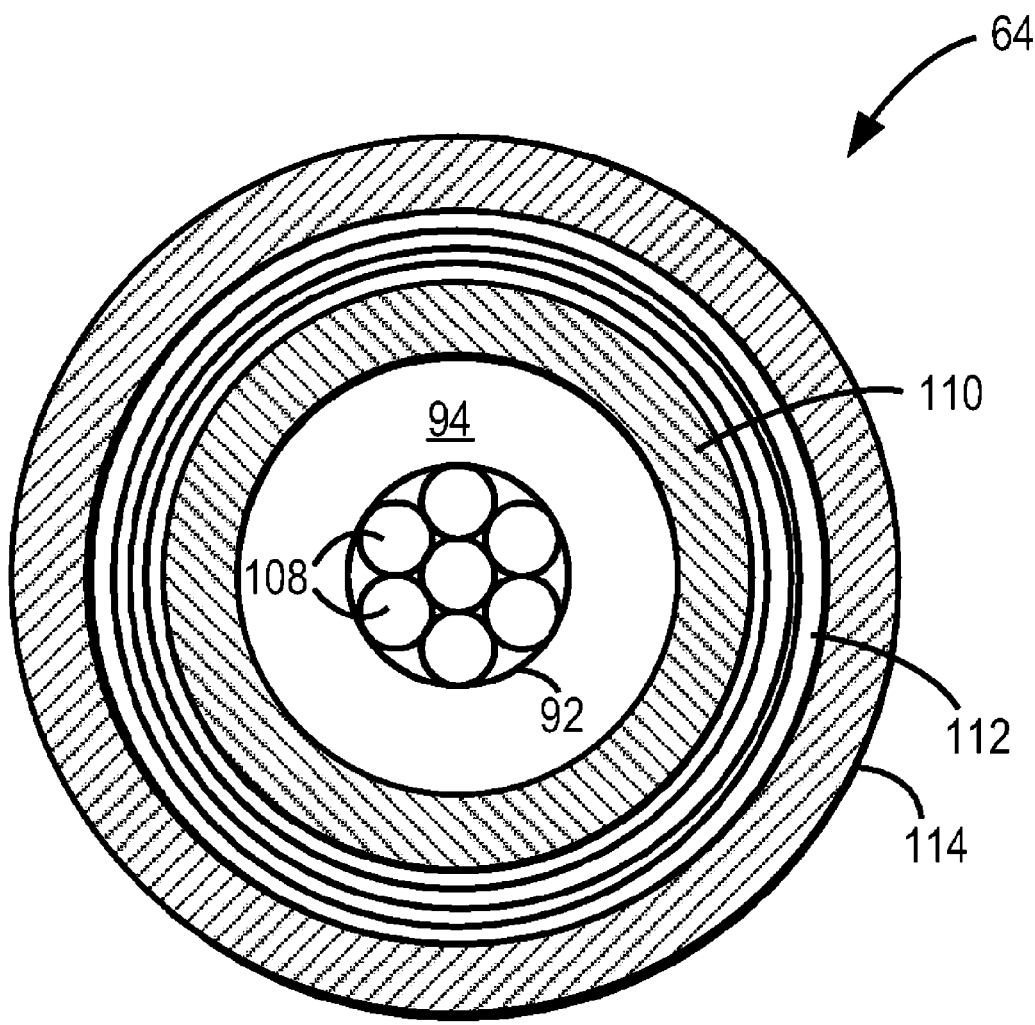
FIG. 7 is a cross-sectional view of a hose surrounding a single winding of a coil of the induction heater of FIG. 2.

Referring now to FIG. 7, a construction of hose 64 is shown according to an exemplary embodiment of the invention. The hose 64 is constructed to have an inner liner 110 formed of an electrically non-conductive synthetic rubber material, such as a green styrene-butadiene for example. A reinforcement system, or layer, of plies 112 surrounds the inner liner 110 to provide structural reinforcement to the inner liner. According to one embodiment, plies 112 are constructed as plies of polyester tire cord. An outer liner 114 is applied about the plies 112 to form an exterior of hose 64. Outer liner can be in the form of a single ply of white fiberglass fabric, for example. The construction of hose 64 is thus similar to a "fire hose" construction.

Beneficially, the multi-layer construction of hose 64 shown and described with respect to FIG. 7 is designed to withstand temperatures up to 180° Fahrenheit internally and 1,000° Fahrenheit externally. Additionally, the multi-layer construction of hose 64 provides electrical resistivity greater than 100 gigaohms at 1000 volts DC. The hose 64 maintains a gap 94 between coil 92 and inner liner 110, thereby forming a "water passage" through which coolant can flow about coil 92 (with flow rates approaching 3 gallons per minute), while still providing sufficient electrical isolation as to not create a conductive path for electrical current flow between turns on the coil. The non-conductive nature of hose 64 also provides sufficient electrical resistance as not to create a second current path in parallel with the Litz coil 92.

When compared to a conventional induction heater having a tube coil, the induction heater of the present invention operates approximately 62% more efficiently. That is, only approximately 20% of the total electrical energy applied to an induction heater having a tubular copper coil is used to induce current in the base material whereas an induction heater according to the present invention utilizes approximately 82% of the total electrical energy applied to the coil to induce current in the base material. As such, utilizing a crystal grower according to the present invention, being approximately 62% electrically more efficient that known crystal growers, can result in significant cost savings during operation of the crystal grower. In other words, a 50 kW input with the present invention results in approximately 6 kW of less as compared to 40 kW of less typically associated with a 50 kW input to a conventional induction heater. Additionally, by maintaining gap 94 between coil 92 and hose 64 allows at least a portion of each wire 108 to be cooled by a flow of cooling fluid circulated through hose 64 thereby prolonging the operational life of the induction heater.

Therefore, according to one embodiment of the present invention, a crystal growing apparatus is disclosed having a receptacle constructed to receive a material selected to grow a crystal and an induction heater constructed to heat the material, the induction heater comprising a Litz coil and a hose constructed to receive the Litz coil therein. The hose further comprises an inner liner formed of an electrically non-conductive material, a reinforcement layer surrounding the inner liner to provide structural reinforcement thereto, and an outer liner applied about the reinforcement layer to form an exterior of the hose.

According to another embodiment of the present invention, a method of manufacturing a crystal grower is disclosed. The method includes the steps of providing a reservoir to receive a crystal growing material therein and coiling a Litz coil about the reservoir. The method also includes the steps of attaching at least one leg to the coiled portion of the Litz coil to maintain a coiled orientation of the coiled portion of the Litz coil and casting a refractory housing about the coiled portion of the Litz coil, the refractory housing being affixed to the at least one leg.

According to yet another embodiment of the present invention, an induction heater is disclosed including a casing having a first end and a second end and a coil of woven strands of wire having a first end and a second end and passing through the casing. The induction heater also includes a lead connected to an end of the coil of woven strands of wire and having a passage therethrough, the passage constructed to provide coolant to a space between the coil of woven strands of wire and the casing. The casing further includes an inner liner formed of an electrically non-conductive material, a reinforcement layer surrounding the inner liner to provide structural reinforcement thereto, and an outer liner applied about the reinforcement layer to form an exterior of the hose.

The present invention has been described in terms of the preferred embodiment, and it is recognized that equivalents, alternatives, and modifications, aside from those expressly stated, are possible and within the scope of the appending claims.

What is claimed is:

1. A crystal growing apparatus comprising:
    a receptacle constructed to receive a material selected to grow a crystal; and
    an induction heater constructed to heat the material, the induction heater comprising a Litz coil and a hose constructed to receive the Litz coil therein;
    wherein the hose further comprises:
        an inner liner formed of an electrically non-conductive material;
        a reinforcement layer surrounding the inner liner to provide structural reinforcement thereto; and
        an outer liner applied about the reinforcement layer to form an exterior of the hose.

2. The crystal growing apparatus of claim 1 further comprising a water passage extending through the hose and constructed to allow a water flow therethrough to cool the Litz coil.

3. The crystal growing apparatus of claim 2 wherein the water passage is configured to accommodate a flow rate of 3 gallons per minute.

4. The crystal growing apparatus of claim 1 wherein the hose is configured to have an electrical resistivity of greater 100 gigaohms at 1000 Volts DC.

5. The crystal growing apparatus of claim 1 wherein the inner liner is configured to operate at a temperature up to 180 degrees Fahrenheit, and wherein the outer liner is configured to operate at a temperature up to 1000 degrees Fahrenheit.

6. The crystal growing apparatus of claim 5 further comprising a housing positioned about the induction heater, and wherein the Litz coil and the hose are routed within the housing so as to encircle the receptacle.

7. The crystal growing apparatus of claim 6 wherein the housing is composed of a castable refractory material.

8. The crystal growing apparatus of claim 1 further comprising a replaceable liner positioned between the receptacle and the induction heater, the replaceable liner configured to thermally insulate the induction heater from the receptacle.

9. A method of manufacturing a crystal grower comprising:
    providing a reservoir to receive a crystal growing material therein;
    coiling a Litz coil about the reservoir;
    attaching at least one leg to the coiled portion of the Litz coil to maintain a coiled orientation of the coiled portion of the Litz coil; and
    casting a refractory housing about the coiled portion of the Litz coil, the refractory housing being affixed to the at least one leg.

10. The method of claim 9 further comprising providing a hose to receive the Litz coil, wherein providing the hose comprises:
    providing an inner liner formed of an electrically non-conductive material, the inner liner having an inner diameter greater than an outer diameter of the Litz coil such that a space is maintained therebetween to allow for flow of a coolant between the Litz coil and the inner liner;
    providing a reinforcement layer positioned about the inner liner to provide structural reinforcement thereto; and
    providing an outer liner applied about the reinforcement layer to form an exterior of the hose.

11. The method of claim 9 further comprising positioning a replaceable liner between the reservoir and the Litz coil to thermally insulate the Litz coil from the reservoir.

12. The method of claim 9 wherein attaching at least one leg to the coiled portion of the Litz coil comprises attaching at least one leg having a bottom surface coinciding with a bottom surface of the housing.

13. The method of claim 9 wherein attaching at least one leg to the coiled portion of the Litz coil comprises attaching at least one leg having a bottom surface extending down past a bottom surface of the housing.

14. An induction heater comprising:
    a casing having a first end and a second end;
    a coil of woven strands of wire having a first end and a second end and passing through the casing; and
    a lead connected to an end of the coil of woven strands of wire and having a passage therethrough, the passage constructed to provide coolant to a space between the coil of woven strands of wire and the casing;
    wherein the casing comprises:
        an inner liner formed of an electrically non-conductive material;
        a reinforcement layer surrounding the inner liner to provide structural reinforcement thereto; and
        an outer liner applied about the reinforcement layer to form an exterior of the casing.

15. The induction heater of claim 14 wherein the casing is configured to have an electrical resistivity of greater 100 gigaohms at 1000 Volts DC.

16. The induction heater of claim 14 wherein the inner liner is configured to operate at a temperature up to 180 degrees Fahrenheit, and wherein the outer liner is configured to operate at a temperature up to 1000 degrees Fahrenheit.

17. The induction heater of claim 14 further comprising a housing having an opening therethrough and extending about the casing, the housing being composed of a castable refractory material.

18. The induction heater of claim 14 wherein individual wires of the coil of woven strands of wire are electrically isolated from one another along a length of the individual wires.

19. The induction heater of claim 14 incorporated into a crystal growing device and constructed to heat a crystal growing material.

* * * * *